United States Patent [19]
Lichtenberg et al.

[11] Patent Number: 5,266,558
[45] Date of Patent: Nov. 30, 1993

[54] SUPERCONDUCTING CIRCUIT ELEMENTS WITH METALLIC SUBSTRATE AND METHOD FOR MANUFACTURING THE SAME

[75] Inventors: Frank Lichtenberg, Adliswil; Jochen Mannhart, Au, both of Switzerland; Darrell Schlom, Menlo Park, Calif.

[73] Assignee: International Business Machines Corporation, Armonk, N.Y.

[21] Appl. No.: 843,880

[22] Filed: Feb. 27, 1992

[30] Foreign Application Priority Data

May 1, 1991 [EP] European Pat. Off. ........ 91810336.7

[51] Int. Cl.$^5$ ................ H01L 39/14; H01L 39/22; H01B 12/00; B05D 5/12
[52] U.S. Cl. ........................................ 505/1; 505/701; 257/33; 257/35; 257/39; 427/62
[58] Field of Search ............... 505/1, 701, 833, 874; 357/5; 257/33, 35, 39

[56] References Cited

U.S. PATENT DOCUMENTS 4,994,435 2/1991 Shiga et al. ............................. 505/1

FOREIGN PATENT DOCUMENTS 0409338 1/1991 European Pat. Off.
9004857 5/1990 Int'l Pat. Institute.

OTHER PUBLICATIONS

Hebard et al., "Experimental Considerations in the Quest for a Thin-Film Superconducting Field-Effect Transistor", IEEE Trans. on Mag., vol. Mag-23, No. 2, Mar. 1987, pp. 1279-1282.

J. J. Randall et al., "Preparation of Some Ternary Oxides of the Platinum Metals".
Journal of American Chemical Society, vol. 81, Jun. 5, 1959, pp. 2629-2631.

Primary Examiner—Rolf Hille
Assistant Examiner—Mahshid Saadat
Attorney, Agent, or Firm—Blaney Harper; Robert M. Trepp

[57] ABSTRACT

These superconducting circuit elements, namely SNS heterostructures, such as, e.g. Josephson junctions and field-effect transistors, have a sandwich structure consisting of at least one layer of high-$T_c$ superconductor material arranged adjacent to a metallic substrate, possibly with an insulating layer in between, the substrate, the superconductor and—if present—the insulator all consisting of materials having at least approximately matching molecular structures and lattice constants. Electrical contacts, such as source, drain and gate electrodes are attached to the superconductor layer and to the substrate, respectively. The electrically conductive substrate consists of a metallic oxide such as strontium ruthenate $Sr_2RuO_4$, whereas the superconductor layer is of the copper oxide type and may be $YBa_2Cu_3O_{7-\delta}$, for example. The insulator layer (10) may consist of $SrTiO_3$. The manufacture of these devices starts with the preparation of the substrate material from a 2:1,1 molar ratio of $SrCO_3$ to $RuO_2$ and involves a floating zone melting process yielding single crystals of the strontium ruthenate $Sr_2RuO_4$ material onto whose (001) surface the superconductor layer as well as the barrier layer can be epitaxially deposited.

11 Claims, 2 Drawing Sheets

SUPERCONDUCTING CIRCUIT ELEMENTS WITH METALLIC SUBSTRATE AND METHOD FOR MANUFACTURING THE SAME

BACKGROUND

This invention relates to superconducting circuit elements, namely heterostructures such as SNS Josephson junctions and field-effect transistors, having a sandwich structure consisting of at least one layer of high-$T_c$ superconductor material arranged adjacent to a metallic substrate, having an insulating layer interposed between the high $T_c$ material and the metallic substrate. Both the substrate and the insulator consist of materials having structural properties sufficiently similar to those of the superconductor so that mechanical and chemical compatibility is guaranteed.

For device applications of high-$T_c$ superconductors, it is desirable to find electrically conductive materials, in particular metals, which are compatible with the high-$T_c$ superconductor materials. Compatibility in this context means a best possible match of the respective lattice constants, and the absence of deleterious diffusion effects at the interfaces of the materials involved. These materials may be used, for example, in thin film form for SNS heterostructures (where S stands for superconductor, and N stands for normal metal), or they may serve as the bulk substrate in a field-effect transistor among other applications.

European application EP-A-0 409 338 discloses a planar Josephson device of the type where at least one layer of non-superconducting material is arranged between two layers of a superconductor material. In one embodiment described, the superconductor is $YBa_2Cu_3O_{7-\delta}$ and the non-superconductor is silver sulphate $Ag_2SO_4$. The silver sulphate being connected to the superconductor through layers of silver which serve to prevent diffusion of the sulphate into the superconductor.

The existence of an electrical field-effect in copper oxide high-$T_c$ superconductors (although later found to be very small) has already been reported by U. Kabasawa et al. in Japanese Journ. of Appl. Phys. 29 L86, 1990, and EP-A-0 324 044 actually describes a three-terminal field-effect device with a superconducting channel. Electrical fields are used to control the transport properties of channel layers consisting of high-$T_c$ superconductor materials. While this seemed to be a promising approach, growth studies of such devices have shown that in the suggested configuration, the ultrathin superconducting layers readily degrade during deposition of insulator layer and top electrode.

The lattice constant matching problem has been tackled by using doped and undoped versions of the same material. In particular, the substrate, is used as the gate electrode of a field-effect transistor of the MISFET type. The substrate consists of conducting niobium-doped strontium titanate. Onto that substrate, a barrier layer consisting of undoped strontium titanate is epitaxially grown, and onto the latter the current channel layer consisting of the superconducting $YBa_2Cu_3O_{7-\delta}$ is epitaxially deposited. It has been found (cf. H. Hagesawa et al., Jap. Journ. Appl. Phys., Vol. 28 (1989) L2210) that during film growth a thin insulating surface layer forms on the Nb-doped $SrTiO_3$, reducing the sensitivity of the device. The formation of this layer is possible due to a diffusion of Nb atoms from the gate/insulator interface into the bulk of the gate electrode.

SUMMARY OF THE INVENTION

It is an object of the present invention to overcome these disadvantages of the prior art. In accordance with the invention, metallic strontium ruthenate (or strontium ruthenium oxide) $Sr_2RuO_4$ is used as substrate material for the high-$T_c$ superconductor and circuit elements formed from the high-$T_c$ superconductor. These superconducting circuit elements, namely SNS heterostructures, such as, e.g. Josephson junctions and field-effect transistors, have a sandwich structure consisting of at least one layer of high-$T_c$ superconductor material arranged adjacent to a metallic substrate, possibly with an insulating layer in between, the substrate, the superconductor and —if present—the insulator all consisting of materials having at least approximately matching molecular structures and lattice constants. Electrical contacts, such as source, drain and gate electrodes are attached to the superconductor layer and to the substrate, respectively. The electrically conductive substrate consists of a metallic oxide such as strontium ruthenate $Sr_2RuO_4$, whereas the superconductor layer is of the copper oxide type and may be $YBa_2Cu_3O_{7-\delta}$, for example. The insulator layer may consist of $SrTiO_3$. The manufacture of these devices starts with the preparation of the substrate material from a 2:1,1 molar ratio of $SrCO_3$ to $RuO_2$ and involves a floating zone melting process yielding single crystals of the strontium ruthenate $Sr_2RuO_4$ material onto whose (001) surface the superconductor layer as well as the barrier layer can be epitaxially deposited.

DESCRIPTION OF THE PREFERRED EMBODIMENT

Figure 1:
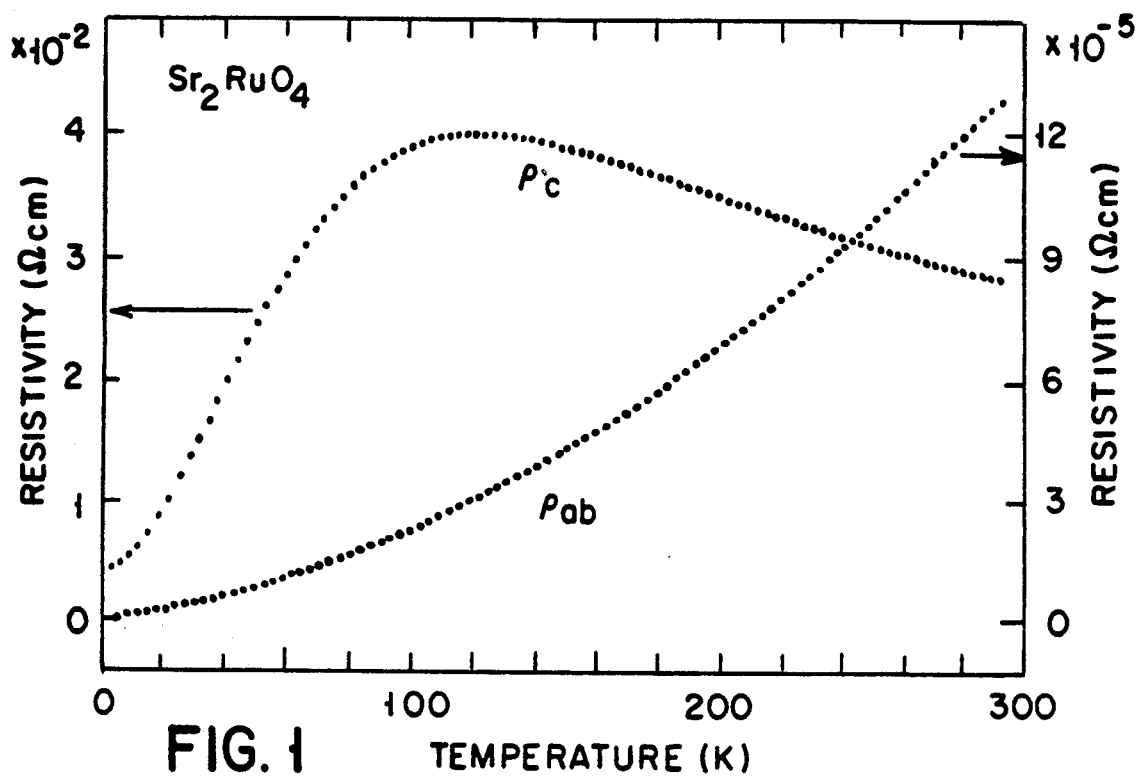
FIG. 1 shows the resistivity $\rho_c$-versus-temperature characteristic of $Sr_2RuO_4$.

The prior art problem of undesired surface layers on the Nb-doped $SrTiO_3$ can be avoided if substrates are used as gate electrodes which are intrinsically metallic and that do not rely on dopants to induce metallic behavior. However, the intrinsically metallic substrate must be compatible with the high-$T_c$ superconductor material.

Most of the high-$T_c$ superconductor materials known today have very similar molecular structures and essentially the same lattice constants. Examples of high-$T_c$ superconductors of the copper oxide type which can be used in connection with the present invention are listed in the table below, together with the respective reference where a description can be found:

| Superconductor Composition | Reference |
| --- | --- |
| Tl—Ba—Ca—CuO | EP-A-0 332 309 |
| Tl—Ba—Ca—Y—CuO | EP-A-0 368 210 |

-continued

| Superconductor Composition | Reference |
| --- | --- |
| Bi—Sr—Ca—CuO | EP-A-0 332 291 |
|  | EP-A-0 362 000 |
|  | EP-A-0 366 510 |
| Bi—Pb—Sr—Ba—CuO | EP-A-0 348 896 |
| Bi—Pb—Sr—Ca—CuO | EP-A-0 400 666 |
| La—Y—Bi—Sr—CuO | EP-A-0 287 810 |
| Eu—Ba—CuO | EP-A-0 310 246 |
| Yb—Ba—CuO | EP-A-0 310 247 |
| Sr—La—CuO | EP-A-0 301 958 |

In addition to the high-$T_c$ copper oxide superconductor materials of which examples are listed above, there are some other high-$T_c$ superconductor materials known which do not rely on copper but other elements, such as bismuth, for example. One such material is $Ba_{0.6}K_{0.4}BiO_3$ which was described by R. J. Cava et al., "Superconductivity Near 30K Without Copper: The $Ba_{0.6}K_{0.4}BiO_3$ Perovskite", Nature, Vol. 332, No. 6167, pp. 814–816 (1988). The common characteristic of all known high-$T_c$ superconductor materials which may be used in connection with the invention is that they have a perovskite or perovskite-related structure.

Apparently, of all high-$T_c$ superconductor materials known so far, $YBa_2Cu_3O_{7-\delta}$ is the one best investigated. This material and methods for its manufacture are, for example, described in the following references: EP-A-0 282 199, EP-A-0 285 168, EP-A-0 286 823, EP-A-0 301 655, EP-A-0 310 248, EP-A-0 311 804, EP-A-0 321 862, EP-A-0 341 788, EP-A-0 349 444, EP-A-0 405 352.

Without intending to be restrictive, the description of the invention given below will use $YBa_2Cu_3O_{7-\delta}$ (with $0 \leq \delta \leq 1$) as an example of a high-$T_c$ superconductor material, with the understanding that any other high-$T_c$ superconductor material can be used instead, provided its molecular structure and lattice constants are sufficiently close to those of strontium ruthenate $Sr_2RuO_4$, and this is the case at least with all known high-$T_c$ copper oxide superconductors and the bismuth oxide compound mentioned above.

In accordance with the present invention, the disadvantages of the prior art are overcome by superconducting circuit elements having a multilayered structure, comprising at least one layer of a high-$T_c$ superconductor material arranged adjacent to a substrate consisting of a metallic conductor material having a molecular structure and lattice constants which at least approximately match those of said high-$T_c$ superconductor material, the circuit elements being characterized in that said high-$T_c$ superconductor material is of the perovskite-related type and that said electrically conductive substrate consists of strontium ruthenate $Sr_2RuO_4$.

The existence of $Sr_2RuO_4$, as a bulk material and a paramagnetic electrical conductor, is already known from reports by J. J. Randall et al., "The Preparation of Some Ternary Oxides of the Platinum Metals", J. Am. Chem. Soc. Vol. 81 (1959) pp. 2629–2631, and by A. Callaghan et al., "Magnetic Interactions in Ternary Ruthenium Oxides", Inorganic Chem., Vol. 5, No. 9 (1966) pp. 1572–1576. Of course, at the time of these reports, the high-$T_c$ copper oxide superconductor materials were still unknown. Single-crystals of $Sr_2RuO_4$ were grown for the first time by the inventors and revealed a highly conductive metallic in-plane behavior which was not before known from the ceramic $Sr_2RuO_4$ bulk material.

The method for manufacturing superconducting circuit elements in accordance with the invention is characterized by the following steps:

Weighing appropriate ratios of strontium carbonate $SrCO_3$ and ruthenium dioxide $RuO_2$, and grinding;

Mixing the powder with water and pressing it to form two rods;

Sintering the rods in air at a temperature of about 1300° C.;

Melting the rods in air in a floating zone melting process;

Growing samples from the melt having cylindrical shape with layers (a-b-planes) of strontium ruthenate $Sr_2RuO_4$ along the axis of the cylinder;

Cleaving the melt-grown samples to obtain single-crystal substrates having defined crystallographic surfaces;

Rinsing the substrate in a cleaning solvent;

Attaching the single crystal to the heater of a sputtering chamber and sputtering with the following parameters;

substrate heater block temperature: 700°–750° C.;
total pressure ($Ar/O_2 = 2:1$): 0,845 mbar;
plasma discharge: 150–170 V, 450 mA,
aftergrowth cooldown in $\approx$ 0,5 bar $O_2$ lasting for $\approx$ 1 hour;

Epitaxially growing on at least one (001)-surface of the $Sr_2RuO_4$ substrate a film of a high-$T_c$ superconducting material, with the thickness of the superconductor film being in the range of 1 to 1000 nm;

Depositing metal pads onto the superconductor layer(s) to form electrical contacts;

Applying a metal pad to the surface of the substrate facing away from said superconducting layer to form an electrical contact.

Figure 2:
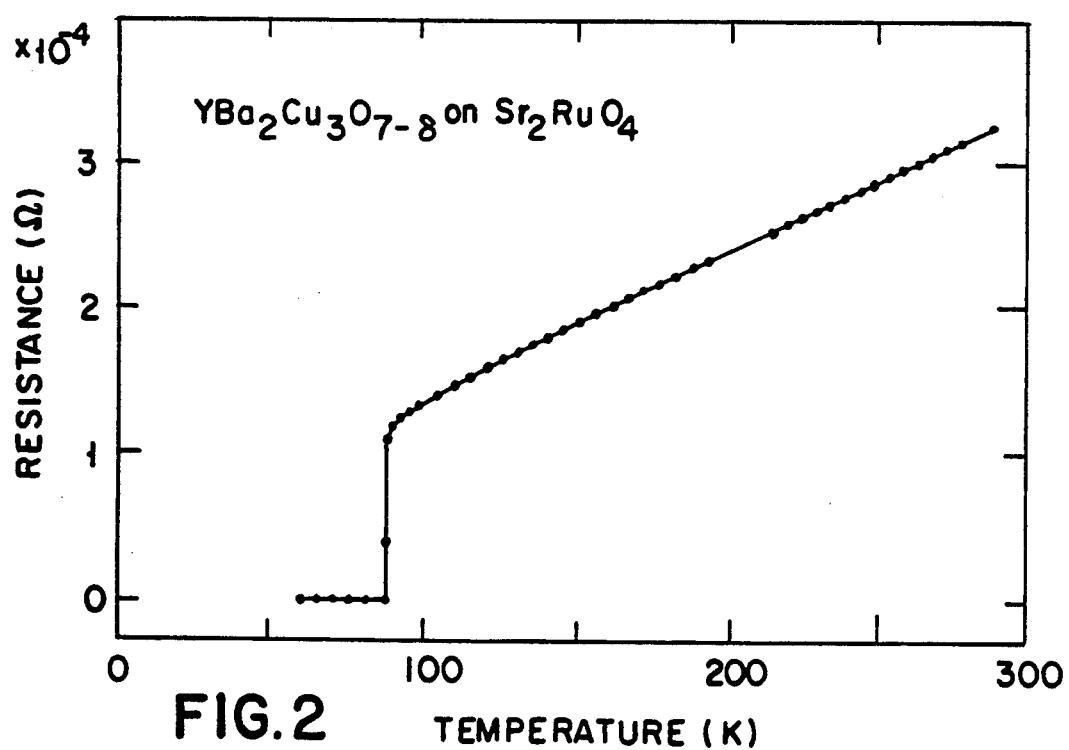
FIG. 2 is a diagram showing the resistance of a $YBa_2Cu_3O_{7-\delta}$ film grown on a $Sr_2RuO_4$ substrate in dependence on temperature.
Figure 3:
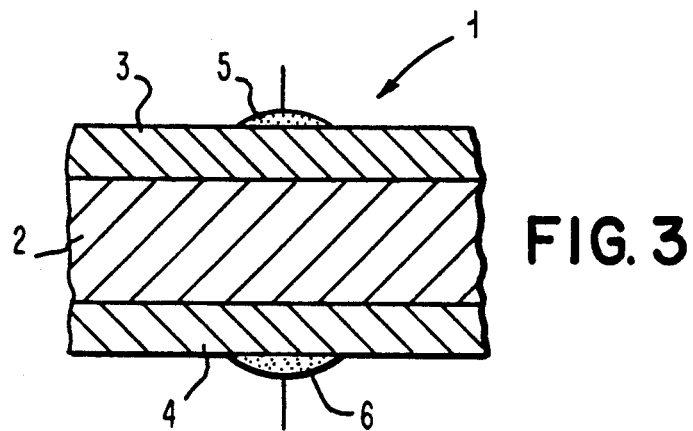
FIG. 3 shows an SNS heterostructure with a $Sr_2RuO_4$ substrate.
Figure 4:
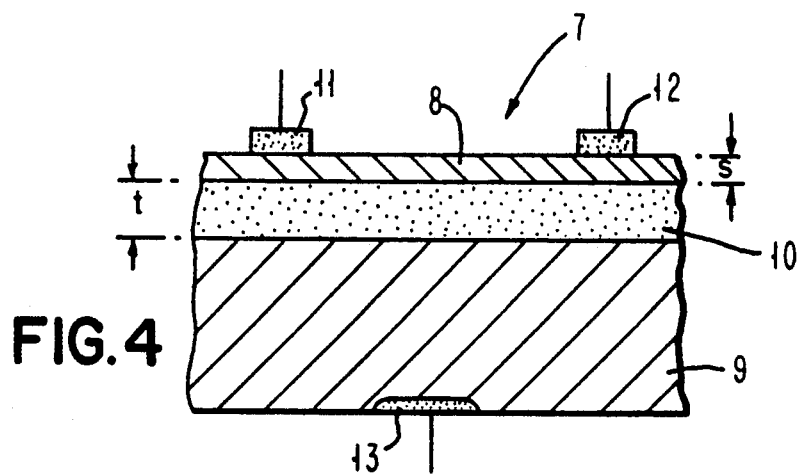
FIG. 4 is an inverted MISFET structure using a $Sr_2RuO_4$ substrate.

Details of three embodiments of the invention will hereafter be described by way of example and with reference to the drawings in which:

FIG. 1 shows the resistivity $\rho_c$-versus-temperature characteristic of $Sr_2RuO_4$;

FIG. 2 is a diagram showing the resistance of a $YBa_2Cu_3O_{7-\delta}$ film grown on a $Sr_2RuO_4$ substrate in dependence on temperature;

FIG. 3 shows an SNS heterostructure with a $Sr_2RuO_4$ substrate;

FIG. 4 is an inverted MISFET structure using a $Sr_2RuO_4$ substrate;

FIG. shows essentially the device of FIG. 4 with a supporting layer.

A metallic substrate is highly desirable for thin film applications of high-$T_c$ superconductor materials, such as, e.g., $YBa_2Cu_3O_{7-\delta}$, for a number of reasons:

It can be used as a gate electrode in a field-effect device.

It can be used as a shunt resistance.

It has a higher thermal conductivity than $SrTiO_3$, and, therefore, allows denser packaging of the devices.

It offers a convenient electrical contact from the superconductor to the external world or to other devices.

The problem with the metals and alloys so far considered for use in connection with high-$T_c$ superconductor materials is simply that none of them has a lattice that matches the lattice structure of the superconductor material in question to any useful extent. Also, in some cases, diffusion across the interface between the materials tends to destroy the ability to become superconducting. Accordingly, none of these metals has found an application together with a high-$T_c$ superconductor, except, perhaps as a contact material.

In contrast, the paramagnetic $Sr_2RuO_4$ has a layered $K_2NiF_4$-structure and is a metallic conductor along its layers, with an excellent lattice match to copper oxide superconductors, such as $YBa_2Cu_3O_{7-\delta}$. At 300K, $Sr_2RuO_4$ is tetragonal with lattice constants of a=b=0.387 nm, and c=1,274 nm, as compared to $YBa_2Cu_3O_{7-\delta}$ which is orthorhombic with lattice constants of a=0.382 nm, b=0.389 nm, and c=1.17 nm. This small lattice mismatch (of about 1.3%) compares favorably even to that between $YBa_2Cu_3O_{7-\delta}$(001) and strontium titanate $SrTiO_3\{100\}$, the latter being the standard insulating substrate for the growth of superconducting copper oxides, and which at 300K is cubic, with a=0.391 nm (as shown in EP-A-0 324 220).

FIG. 1 shows the resistivity $\rho_c$-versus-temperature characteristic measured at a representative $Sr_2RuO_4$ crystal. No corrections for inhomogeneous current density distribution had to be made. In the a-b plane, the resistivity ranges from $\rho_{ab} \approx 10^{-4} \Omega cm$ at room temperature down to $\rho_{ab} \approx 10^{-6} \Omega cm$ at 4.2K demonstrating the highly conductive metallic in-plane behavior of $Sr_2RuO_4$. The observed resistivity along the c-axis resembles that of the layered materials $TaS_2$ and graphite. Like $Sr_2RuO_4$, they exhibit a metallic behavior along the layers and a resistivity maximum between room temperature and 4.2K perpendicular to the layers.

Generally, when it is possible to grow $Sr_2RuO_4$ on $SrTiO_3$ and vice-versa, thin film devices become feasible where insulating, superconducting and metallic layers can be combined in any way.

To demonstrate their compatibility, thin films of $YBa_2Cu_3O_{7-\delta}$ were grown onto the a-b-plane of a $Sr_2RuO_4$ crystal with very satisfactory results. The diagram of FIG. 2 shows the resistance of such a film in dependence on the temperature, with a critical temperature $T_c$ of 86K.

Referring now to FIG. 3, there is shown an SNS heterostructure 1 comprising an electrically conducting $Sr_2RuO_4$ crystal forming a substrate 2 and carrying on both sides thin-film superconductor layers 3 and 4 consisting of $YBa_2Cu_3O_{7-\delta}$. As mentioned above, the lattice constants of the substrate material match the lattice constants of the superconductor material to such an extent that epitaxial growth of the superconductor films 3, 4 onto the substrate 2 is possible without a problem. Contact terminals 5 and 6 are attached to superconductor layers 3 and 4, respectively.

FIG. 4 shows a field-effect transistor 7 having an inverted MISFET-structure. In this structure, a superconducting $YBa_2Cu_3O_{7-\delta}$ film 8 of the thickness s is separated from a $Sr_2RuO_4$ crystal substrate 9 serving as a gate electrode, by an insulating $SrTiO_3$ barrier layer 10 of the thickness t. Besides the thickness s of the superconductor film 8, the resistivity $\rho_1$ and the breakthrough field strength $E_{BD}$ of the insulator layer 10 are crucial parameters. The required values for $E_{BD}$ and for $\rho_1$ can be simply estimated, if space charge effects are neglected: To induce a surface charge density in superconducting film 8 which corresponds to the unperturbed density n of mobile charge carriers (n≃3 ... 5×10²¹/cm³), the capacitor formed by substrate 9 and superconductor film 8 has to be biased with a voltage $$V_G = \frac{qnst}{\epsilon_0 \epsilon_i} \quad (1)$$

where q is the elementary charge, $\epsilon_0$ and $\epsilon_1$ are respectively the dielectric constants of the vacuum and of the barrier layer material. Equation (1) rewritten provides the condition for the breakdown field strength $E_{BD}$:

$$E_{BD} \geq \frac{V_g}{t} = \frac{qns}{\epsilon_0 \epsilon_i}. \quad (2)$$

Equation (2) implies that to modulate the carrier density n in high-$T_c$ superconductors substantially, the product $\epsilon_1 \times E_{BD}$ has to be of the order of $10^8$ V/cm. (For comparison, $SiO_2$ has an $\epsilon_1 \times E_{BD}$ product of $4 \times 10^7$ V/cm at room temperature.)

In addition, the normal-state resistivity $\rho_1$ of the insulator has to be sufficiently high to avoid leakage currents which result in an input loss $V_G \times I_G$, the latter factor being the gate current. For a typical case of $I_G < I_{DS}/100$ and $I_{DS} = 10 \mu A$, and an area of the substrate 9 of 1 mm², the resistivity $\rho_1$ must be higher than $10^{14} \Omega cm/\epsilon_1$ at operating temperature.

In view of these requirements, insulating layers with high dielectric constants are recommended. Therefore, $SrTiO_3$ is a good material for insulating barrier layer 10 because of its good compatibility with the growth of copper oxide superconductors, such as $YBa_2Cu_3O_7$. The compatibility of $YBa_2Cu_3O_7$ with $SrTiO_3$ has already been pointed out in EP-A-0 299 870 and EP-A-0 301 646.

The dielectric constant $\epsilon_1$ of $SrTiO_3$ being between 40 and 300 (depending on the purity of the material), the breakdown field being on the order of $10^8$ V/cm, and with an operating voltage $V_G = 5$ V, equation (2) suggests that a monomolecular (i.e. unit cell) layer of superconductor material would meet the requirements. Accordingly, with s=1,2 nm and $\epsilon_1 = 260$ and a carrier density $n = 3 \times 10^{21}$ cm$^{-3}$, equation (1) yields a value of $t \approx 20$ nm.

The manufacture of the Josephson junction heterostructure of FIG. 3 and of the inverted MISFET device in accordance with FIG. 4 preferably involves the following steps:

1. Appropriate ratios, molar ratios, for example, of strontium carbonate $SrCO_3$ and ruthenium dioxide $RuO_2$ are weighed with an accuracy of better than 1‰.
2. After grinding, the powder is mixed with water and pressed to form rods of, say, 5 mm diameter, one 10 mm in length, the other 100 mm in length, for example.
3. The rods are sintered on $Al_2O_3$ boats in air at about 1300° C.
4. Using the floating zone process, the rods are melted in air in a mirror cavity with focused infrared radiation, the short rod being used as the seed, the long rod being used as the feed material.
5. Single-crystals are grown from the melt. The melt-grown samples have cylindrical shape with layers (a-b-planes) of $Sr_2RuO_4$ grown along the axis of the cylinder.

The growth of the $Sr_2RuO_4$ crystals is complicated by the volatility of $RuO_2$ which leads to the segregation of SrO. To compensate for this segregation, an excess of $RuO_2$ must be used in the starting material. A molar ratio of 2:1,1 of $SrCO_3$ and $RuO_2$ is recommended to minimize the amount of segregated SrO. In order to grow large crystals, the amount of molten material as well as its composition should be kept constant. This is difficult to achieve probably owing to the continuous evaporation of $RuO_2$ and because of the low density of the rods.

6. The crystals are then cleaved.

Because of the layered structure of $Sr_2RuO_4$, the melt-grown samples can be cleaved easily, and single-crystals may be obtained from the interior part of the cylinder.

With this technique it is possible to grow a cylindrical $Sr_2RuO_4$ crystal of about 5 mm diameter and 10 mm length. Having prepared the single-crystal $Sr_2RuO_4$ substrate, the manufacture of the heterostructure 1 of FIG. 3 involves the following additional steps:

1. The substrate 2 is rinsed in acetone and propanol and attached to the heater of the sputtering chamber with silver paint, for example.
2. On the upper (001) surface of the $Sr_2RuO_4$ substrate 2, a superconducting film 3 of, for example, $YBa_2Cu_3O_{7-\delta}$ is epitaxially grown by hollow cathode rf-magnetron sputtering, wherein the value of $\delta$ is preferably kept equal to zero, but can be made as large as 1. The sputter parameters used encompass a substrate heater block temperature of 700°–750° C., a total pressure ($Ar/O_2=2:1$) of 0,845 mbar, a plasma discharge of 150–170 V and 450 mA, and an aftergrowth cooldown in ≈0,5 bar $O_2$ lasting for ≈ 1 hour. The thickness of the superconductor film 3 can finally be in the range of 1 to 1000 nm.
3. The same step is repeated for the lower (001) surface of the $Sr_2RuO_4$ substrate 2 to form superconductor layer 4.
4. Electrical contacts are then made in the form of indium dots, silver paint, or metal pads, such as gold pads 5 and 6, for example, on the superconductor layers 3 and 4, respectively.

Figure 5:
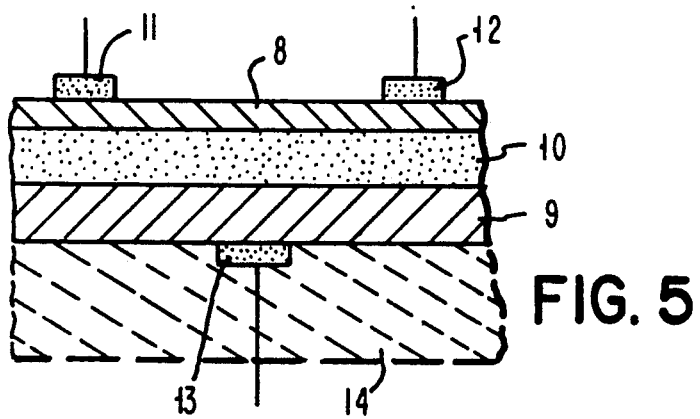
FIG. 5 shows essentially the device of FIG. 4 with a supporting layer.

The manufacture of the MISFET-structure 7 of FIG. 4 involves the following steps additional to the preparation of the $Sr_2RuO_4$ substrate 9:

1. A {100}-oriented $SrTiO_3$ barrier layer 10 is epitaxially grown by reactive rf-magnetron sputtering at 6,7 Pa in an $O_2/Ar$ atmosphere at 650° C. (temperature of the sample holder) as an insulator on top of the $Sr_2RuO_4$ substrate 9 and is polished down to the desired final thickness.
2. On top of the thinned barrier layer 10, a superconductor film 8 (of $YBa_2Cu_3O_{7-\delta}$, for example) with the thickness s is sputtered.
3. Gold pads 11 and 12 are provided on top of the superconductor layer 8 to form source and drain contacts, respectively.
4. On the back side of the substrate 9, a gate electrode 13 in the form of a metal layer, such as a gold layer, for example, is deposited.
5. Optionally, substrate 9 and gate electrode 13 may be arranged on an insulating support layer 14, be it for stability, as indicated in FIG. 5. Support layer 14 may again consist of $SrTiO_3$ and be epitaxially grown be reactive rf-magnetron sputtering. The thickness of this layer can be freely chosen.

From the measurements taken with several sample embodiments of the field-effect transistor in accordance with FIGS. 4 and 5, it has been determined that the operating gate voltage $V_G$ should be in the range between 0,1 and 50 V, preferably 5 V, the thickness s of the superconducting film should be in the range between 1 and 30 nm, and the thickness t of the insulating layer should be in the range between 3 and 100 nm.

In accordance with the invention, MISFET-type heterostructures consisting of high-$T_c$ superconductor/$SrTiO_3$/$Sr_2RuO_4$ multilayers may be made which allow the application of electrical fields larger than $10^7$ V/cm to the superconducting films. In these devices, electric field-effects generate changes in the channel resistance. The high-$T_C$ superconductor films have a preferred thickness on the order of 10 nm and are operated with gate voltages well below 30 Volts. The channel resistivity changes can be attributed to equally strong changes of the carrier density in the high-$T_c$ superconductor.

It should be noted that $Sr_2RuO_4$ can also be used in the form of thin films for certain applications. Those skilled in the art will understand that such films can be made with any of the conventional methods, such as electron beam evaporation, thermal evaporation, chemical vapor deposition, metalorganic vapor deposition, laser ablation, rf-magnetron sputtering, spinning-on, molecular beam epitaxy, etc., for example.

While this invention has been described with respect to plural embodiments thereof, it will be understood by those with skill in the art that changes in the above description or illustrations may be made with respect to form or detail without departing from the spirit or scope of the invention.

We claim:

1. A superconducting circuit element having a multilayered structure, comprising:
   at least one layer of a high-$T_c$ superconductor material arranged adjacent to a substrate consisting essentially of strontium ruthenate $Sr_2RuO_4$ having a molecular structure and lattice constant which at least approximately match those of said high-$T_c$ perovskite superconductor material.

2. A superconducting circuit element in accordance with claim 1, wherein said high-$T_c$ superconductor material consists of $YBa_2Cu_3O_{7-\delta}$, and wherein $0 \leq \delta \leq 1$.

3. A superconducting circuit element in accordance with claim 1, wherein:
   two high-$T_c$ superconducting layers are arranged adjacent said $Sr_2RuO_4$ substrate on opposite sides thereof; and
   contact pads (5, 6) are attached to said superconducting layers forming a Josephson junction.

4. A superconducting circuit element in accordance with claim 3, wherein said high-$T_c$ superconductor material consists of $YBa_2Cu_3O_{7-\delta}$, and wherein $0 \leq \delta \leq 1$.

5. A superconducting circuit element in accordance with claim 1, wherein:
   said $Sr_2RuO_4$ substrate is a single crystal; and
   said superconducting layer is deposited on a (001) surface of said $Sr_2RuO_4$ substrate.

6. A superconducting circuit element in accordance with claim 5, wherein said high-$T_c$ superconductor material consists of $YBa_2Cu_3O_{7-\delta}$, and wherein $0 \leq \delta \leq 1$.

7. A superconducting circuit element in accordance with claim 1, further comprising:
   a barrier layer consisting of a material whose molecular structure and lattice constants at least approximately match those of the materials of said superconductor layer and of said $Sr_2RuO_4$ substrate arranged between said high-$T_c$ superconductor layer and said $Sr_2RuO_4$ substrate.

8. A superconducting circuit element in accordance with claim 7, further comprising:
   first and second contact pads disposed on top of said high-$T_c$ superconducting layer and forming source and drain electrodes, said source and drain electrodes defining a current channel; and a third contact pad attached to said substrate serving as a gate electrode, and forming a field-effect transistor.

9. A superconducting circuit element in accordance with claim 8, wherein said high-$T_c$ superconductor material consists of $YBa_2Cu_3O_{7-\delta}$, and wherein $0 \leq \delta \leq 1$.

10. A superconducting circuit element in accordance with claim 7, wherein said barrier layer consists of strontium titanate $SrTiO_3$.

11. A superconducting circuit element in accordance with claim 10, wherein said high-$T_c$ superconductor material consists of $YBa_2Cu_3O_{7-\delta}$, and wherein $0 \leq \delta \leq 1$.

* * * * *